(12) United States Patent
Liu et al.

(10) Patent No.: US 12,150,352 B2
(45) Date of Patent: Nov. 19, 2024

(54) DISPLAY PANEL, DISPLAY APPARATUS AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Liu, Beijing (CN); Yao Huang, Beijing (CN); Yuanyou Qiu, Beijing (CN); Binyan Wang, Beijing (CN); Zhi Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 524 days.

(21) Appl. No.: 17/425,198

(22) PCT Filed: Sep. 24, 2020

(86) PCT No.: PCT/CN2020/117372
§ 371 (c)(1),
(2) Date: Jul. 22, 2021

(87) PCT Pub. No.: WO2022/061638
PCT Pub. Date: Mar. 31, 2022

(65) Prior Publication Data
US 2022/0320238 A1     Oct. 6, 2022

(51) Int. Cl.
*H10K 59/131* (2023.01)
*H10K 59/12* (2023.01)
(Continued)

(52) U.S. Cl.
CPC .......... *H10K 59/131* (2023.02); *H10K 59/65* (2023.02); *H10K 71/00* (2023.02); *H10K 59/1201* (2023.02)

(58) Field of Classification Search
None
See application file for complete search history.

(56) References Cited

U.S. PATENT DOCUMENTS

| 2021/0012706 A1* | 1/2021 | Yang | G09G 3/32 |
| 2021/0193758 A1* | 6/2021 | Choi | H10K 59/123 |
| 2022/0069047 A1* | 3/2022 | Yang | H10K 59/1213 |

* cited by examiner

*Primary Examiner* — Xiaoming Liu
(74) *Attorney, Agent, or Firm* — Brooks Kushman P.C.

(57) ABSTRACT

A display panel, a display apparatus, a manufacturing method of the display panel are provided. The display panel includes a light-transmitting area including: a first light-transmitting area with multiple light-emitting units distributed at intervals; a second light-transmitting area with multiple light-emitting driving units capable of transmitting light. The first light-transmitting area is connected with the second light-transmitting area; each light-emitting unit is connected with a light-emitting driving unit, the light-emitting driving units are configured to drive the connected light-emitting units to emit light; some light-emitting units are connected with the light-emitting driving units through first connecting wires in the light-transmitting area, some light-emitting units are connected with the light-emitting driving units through second connecting wires outside the light-transmitting area; the second connecting wires are along an edge of the light-transmitting area.

16 Claims, 4 Drawing Sheets

(51) Int. Cl.
*H10K 59/65* (2023.01)
*H10K 71/00* (2023.01)

DISPLAY PANEL, DISPLAY APPARATUS AND MANUFACTURING METHOD THEREOF

CROSS-REFERENCE TO RELATED APPLICATION

This application is the U.S. national phase of PCT Application No. PCT/CN2020/117372 filed on Sep. 24, 2020, which is incorporated herein by reference in its entirety.

TECHNICAL FIELD

The present disclosure relates to the field of display technologies, in particular to a display panel, a display apparatus and a manufacturing method thereof.

BACKGROUND

At present, with the development requirement of the market of full screen display, a main direction of structure design of current display apparatuses is that a camera is arranged in an integrated manner below a display panel.

For the camera integrated below the display panel, in order to realize a shooting function, an area of the display panel that is corresponding to the camera is required to be arranged as a display area capable of transmitting light. Currently, for the off-screen camera, the requirement of a user on light transmission of the light-transmitting display area corresponding to the camera is gradually increased. In order to present a better front shooting effect, the size of the front camera generally needs to be enlarged, and this requires a corresponding increase in the size of the corresponding light-transmitting display area.

However, due to the fact that the light-transmitting display area needs to meet a display function, the number of pixels which can be driven in the light-transmitting display area is limited by the space limitation of driving signal wiring based on the arrangement requirement of pixel units used for image display in the light-transmitting display area. As a result, the size of the light-transmitting display area is limited, and the size of the front camera is affected.

SUMMARY

Embodiments of the present disclosure provide a display panel, a display apparatus, and a manufacturing method of the display panel, which are used for solving the problem that in the conventional technologies, a display panel adopting an under-screen camera is limited by the space of driving signal wiring, and sizes of a light-transmitting display area and a front camera are restricted.

In an aspect, the present disclosure provides a display panel including a light-transmitting area, where the light-transmitting area includes:

a first light-transmitting area, which is provided with multiple light-emitting units distributed at intervals; and
a second light-transmitting area, which is provided with multiple light-emitting driving units capable of transmitting light, where the first light-transmitting area is connected with the second light-transmitting area;
where each light-emitting unit of the multiple light-emitting units is connected with a light-emitting driving unit of the multiple light-emitting driving units, and the light-emitting driving units each are configured to drive the connected light-emitting unit to emit light; part of the multiple light-emitting units are connected with the light-emitting driving units through first connecting wires in the light-transmitting area, and part of the multiple light-emitting units are connected with the light-emitting driving units through second connecting wires outside the light-transmitting area; and the second connecting wires are arranged along an edge of the light-transmitting area.

Optionally, for the display panel, the first connecting wires extend in a first direction, and two ends of each of plurality of the first connecting wires are respectively connected with one light-emitting driving unit and one light-emitting unit;

where each of the second connecting wire includes a first part extending in the first direction and arranged along the edge of the light-transmitting area and two second parts extending in a second direction; and the second direction is perpendicular to the first direction, two ends of one of the two second parts are respectively connected with a first end of the first part and one light-emitting driving unit, and two ends of the other of the two second parts are respectively connected with a second end of the first part and one light-emitting unit.

Optionally, for the display panel, the second light-transmitting area further includes multiple pixel units, and the multiple pixel units are arranged at intervals among the multiple light-emitting driving units.

Optionally, for the display panel, the multiple pixel units and the multiple light-emitting driving units are sequentially arranged in rows and columns in the second light-transmitting area.

Optionally, for the display panel, part of the multiple light-emitting units close to the light-emitting driving units are connected to the light-emitting driving units through the first connecting wires, and part of the multiple light-emitting units remote from the light-emitting driving units are connected to the light-emitting driving units through the second connecting wires.

Optionally, for the display panel, the light-emitting unit includes a light-emitting layer and an electrode plate on a side of the light-emitting layer, the light-emitting driving unit includes a driving electrode; and wherein:

each of the first connecting wires and the second connecting wires is connected to the electrode plate and the driving electrode via through holes; and/or, the second connecting wire is connected with the electrode plate and the driving electrode via through holes, the electrode plate of the light-emitting unit extends to be connected with the driving electrode, and the electrode plate is also used as the first connecting wire.

Optionally, for the display panel, edges of opposite sides of the light-transmitting area are respectively provided with the second connecting wires used for connecting part of the light-emitting units and the light-emitting driving units.

Optionally, for the display panel, the light-emitting units in a same column are respectively connected to the light-emitting driving units in a same column correspondingly.

Optionally, for the display panel, the second light-transmitting area is around the first light-transmitting area.

Optionally, the display panel further includes a display area, multiple pixel units in an array are arranged in the display area, where the display area is around the light-transmitting area, or the light-transmitting area is arranged at an edge of the display area.

In another aspect, embodiments of the present disclosure further provide a display apparatus including the display panel according to any of the embodiments described above.

Optionally, the display apparatus further includes a camera module, and an orthographic projection of the camera module onto a plane where the display panel is located is in the first light-transmitting area.

In another aspect, embodiments of the present disclosure also provide a manufacturing method of the display panel according to any of the embodiments described above, where the method includes:
providing a transparent base substrate;
manufacturing the multiple light-emitting units on a partial area of a first area of the base substrate to form the first light-transmitting area; manufacturing the multiple light-emitting driving units on a partial area of the first area to form the second light-transmitting area; manufacturing the first connecting wires in the first area, where each of some of the multiple light-emitting units is correspondingly connected with one light-emitting driving unit through the first connecting wire; and manufacturing the second connecting wires at an outer edge of the first area, where each of some of the light-emitting units is correspondingly connected with one light-emitting driving unit through the second connecting wire.

Optionally, in the manufacturing method, the light-emitting unit includes an anode, and the light-emitting driving unit includes a source/drain layer; and wherein:
each of the first connecting wire and the second connecting wire is manufactured between the anode and the source/drain layer and is connected to the anode and the source/drain layer via through holes; or, the second connecting wire is manufactured between the anode and the source/drain layer and is connected with the anode and the source/drain layer via through holes, the first connecting wire and the anode are manufactured by a same patterning process, and the anode is also used as the first connecting wire.

BRIEF DESCRIPTION OF THE DRAWINGS

To better clarify technical solutions of embodiments of the present disclosure or the related technologies, drawings used in descriptions of the embodiments are briefly introduced hereinafter. Apparently, the described drawings merely illustrate a part of the embodiments of the present disclosure. A person ordinary skilled in the art can obtain other drawings based on the described drawings without any creative efforts.

DETAILED DESCRIPTION

In order to facilitate understanding of technical problems to be solved, technical solutions and advantages of embodiments of the present disclosure, detailed descriptions are provided hereinafter with reference to the accompanying drawings and specific embodiments.

Figure 1:
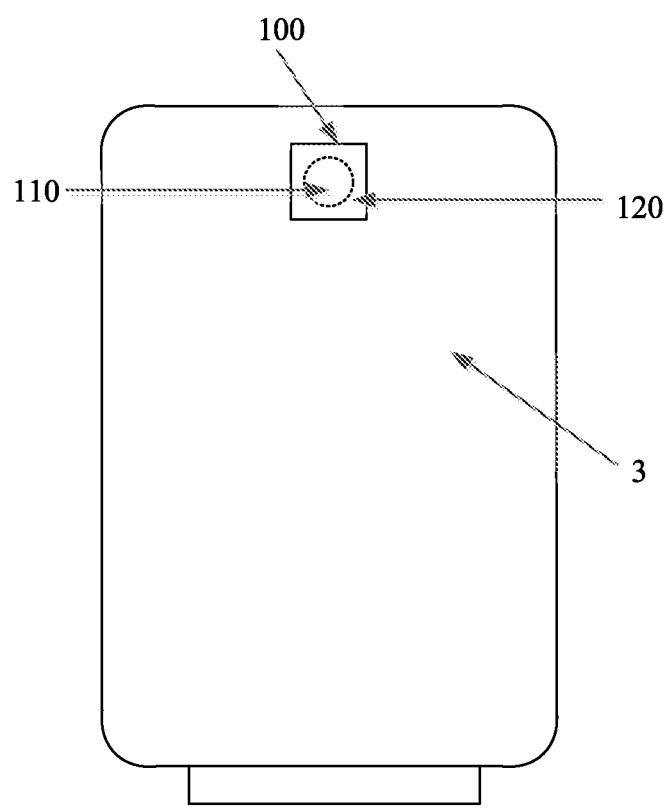
FIG. 1 is a schematic plan view of a display panel according to the present disclosure.
Figure 2:
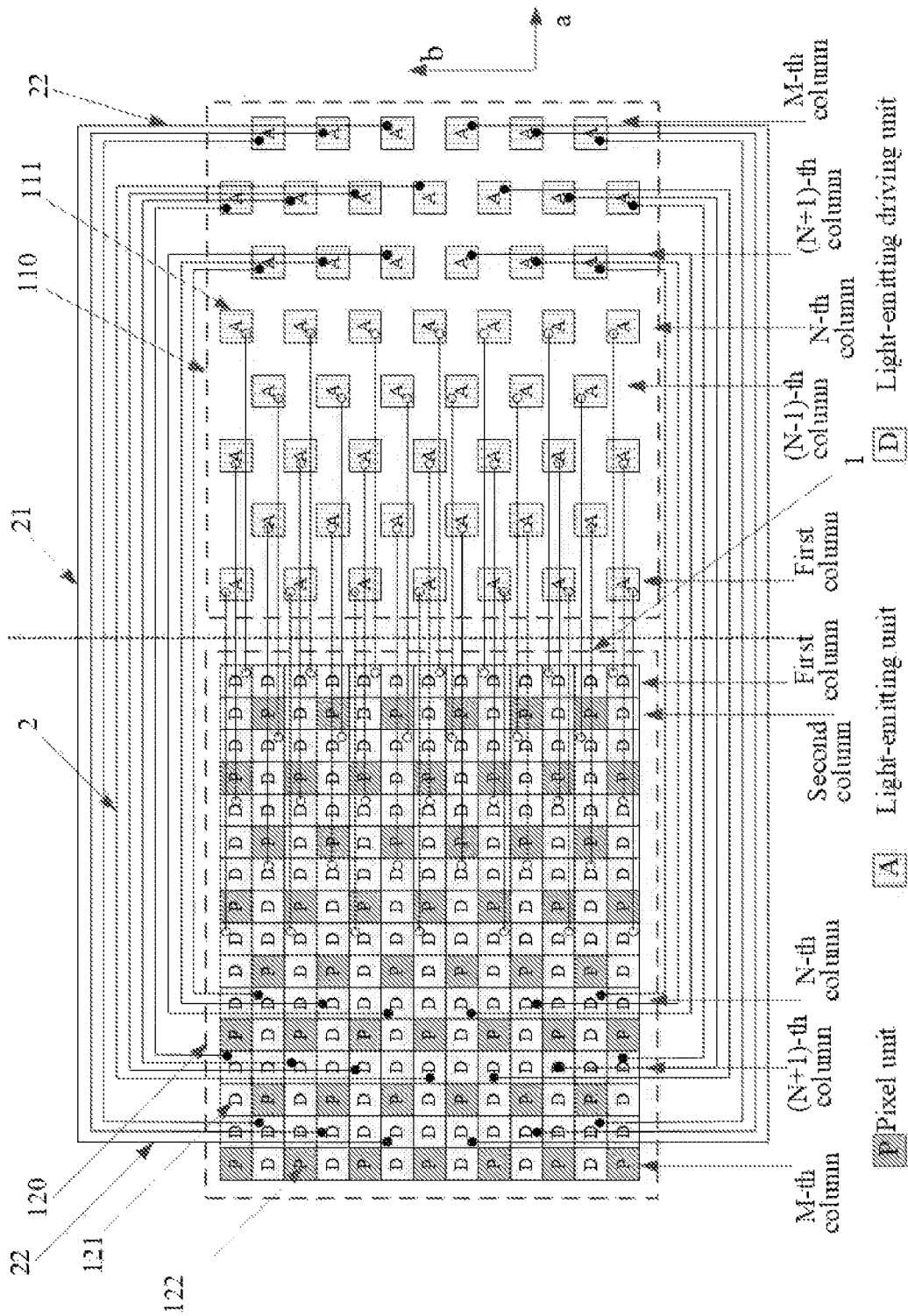
FIG. 2 is a schematic view of arrangement structure of a light-emitting unit and a light-emitting driving unit in a light-transmitting area in a display panel according to the present disclosure.

The embodiments of the present disclosure provide a display panel, as shown in FIGS. 1 and 2, which includes a light-transmitting area 100, where the light-transmitting area 100 includes:
a first light-transmitting area 110, which is provided with multiple light-emitting units 111 distributed at intervals; and
a second light-transmitting area 120, which is provided with multiple light-emitting driving units 121 capable of transmitting light. The first light-transmitting area 110 is connected to the second light-transmitting area 120.

Each of the multiple light-emitting units 111 is connected to a light-emitting driving unit 121 which is used for driving the connected light-emitting unit 111 to emit light. Among the multiple light-emitting units 111, part of the light-emitting units 111 are connected to the light-emitting driving units 121 via first connecting wires 1 located in the light-transmitting area 100, and part of the light-emitting units 111 are connected to the light-emitting driving units 121 via second connecting wires 2 located outside the light-transmitting area 110. The second connecting wires 2 are arranged along an edge of the light-transmitting area 100.

In the embodiments of the present disclosure, optionally, as shown in FIG. 1, the light-transmitting area 100 is formed as part of a display area 3 of the display panel. Optionally, the display panel is an OLED display panel, the light-emitting unit 111 is an OLED light-emitting unit in an OLED pixel unit, and the light-emitting driving unit 121 is a driving unit in an OLED pixel unit that is used for driving an OLED light-emitting unit to emit light.

The light-emitting units 111 and the light-emitting driving units 121 are manufactured on a transparent substrate. In the first light-transmitting area 110, optionally, the light-emitting unit 111 is manufactured by a light-transmitting material, that is, being formed as a structure capable of transmitting light, thereby achieving a light-transmitting effect of the first light-transmitting area 110; optionally, the light-emitting unit 111 is not limited to being made of the light-transmitting material, and the light-transmitting effect of the first light-transmitting area 110 may be achieved by using a light-transmitting function of gaps among the light-emitting units 111 which are distributed at intervals.

In the second light-transmitting area 120, the multiple light-emitting driving units 121 are made of light-transmitting material to form light-transmitting structures, thereby achieving a light-transmitting effect of the second light-transmitting area 120.

In the embodiments of the present disclosure, optionally, as shown in FIG. 1, the display panel further includes a display area 3 in which multiple pixel units in an array are provided. Optionally, the display area 3 is arranged around the light-transmitting area 100, or the light-transmitting area 100 is arranged at an edge of the display area 3. Optionally, the pixel units arranged in the display area 3 may or may not be made of light-transmitting material, which are not limited herein.

For the display panel with the structure according to the embodiments, a camera may be arranged on a side, far away from the display panel, of the light-transmitting area 100. Light incident to the display panel can be transmitted to the camera for image shooting, by utilizing the light transmission function of the first light-transmitting area 110 and/or the second light-transmitting area 120 of the light-transmitting area 100.

In the embodiments of the present disclosure, for the light-transmitting area 100, the light-emitting driving units 121 are used to drive the light-emitting units 111 to emit light, and the display function of the light-transmitting area 100 can be realized. Therefore, the entire display area 3 of the display panel can be used for image display, without affecting the display effect due to the arrangement of the light-transmitting area 100.

Optionally, as shown in FIG. 2, the second light-transmitting area 120 further includes multiple pixel units 122, and each pixel unit 122 includes a light-emitting unit and a light-emitting driving unit that are stacked.

The multiple pixel units 122 are arranged at intervals among the multiple light-emitting driving units 121.

With the structure according to the embodiments, the second light-transmitting area 120 performs the display function by using the arranged pixel units 122.

Optionally, the multiple pixel units 122 may or may not have a light-transmitting function.

In addition, in the embodiments of the present disclosure, optionally, as shown in FIG. 2, the multiple pixel units 122 and the multiple light-emitting driving units 121 are sequentially arranged in rows and columns in the second light-transmitting area 120. An entire area where the multiple pixel units 122 and the multiple light-emitting driving units 121 are distributed forms the second light-transmitting area 120 correspondingly.

Optionally, an entire area where the multiple spaced light-emitting units 111 are distributed or that is covered by the multiple spaced light-emitting units 111 forms the first light-transmitting area 110 correspondingly.

With the display panel according to the embodiments of the present disclosure, the light-emitting units 111 and the light-emitting driving units 121 for driving the light-emitting units 111 to emit light are distributed in different areas so as to satisfy requirement of light-transmitting function of the first light-transmitting area 110 and the second light-transmitting area 120. In addition, the multiple light-emitting units 111 and the multiple light-emitting driving units 121 are respectively connected in one-to-one correspondence, so that light emission of the light-emitting units 111 of the first light-transmitting area 110 is realized for image display of the first light-transmitting area 110. Furthermore, in the multiple light-emitting units 111, a part of the light-emitting units 111 are connected to the light-emitting driving units 121 through the first connecting wires 1 in the light-transmitting area 100, and a part of the light-emitting units 111 are connected to the light-emitting driving units 121 through the second connecting wires 2 outside the light-transmitting area 100; therefore, more light-emitting units 111 and light-emitting driving units 121 can be provided in the light-transmitting area 100, as compared with a case where connecting wires between the light-emitting units 111 and the light-emitting driving units 121 are all arranged in the light-transmitting area 100; in this way, the number of drivable pixels can be increased, so that the pixel density of the light-transmitting area 100 can be improved or the size of the light-transmitting area 100 can be increased, which solves the problem that in the conventional technologies, the sizes of the light-transmitting display area and the front camera are limited by the space of driving signal wiring.

In the display panel according to the embodiments of the present disclosure, as shown in FIG. 2, the first connecting wires 1 extend along a first direction a, and two ends of each first connecting wire 1 are respectively connected to a light-emitting driving unit 121 and a light-emitting unit 111.

Each second connecting wire 2 includes a first part 21 extending in the first direction and arranged along the edge of the light-transmitting area 100 and two second parts 22 extending in a second direction b; and the second direction b is perpendicular to the first direction a, where two ends of one of the two second parts 22 are connected to a first end of the first part 21 and a light-emitting driving unit 121 respectively, and two ends of the other of the two second parts 22 are connected to a second end of the first part 21 and a light-emitting unit 111 respectively.

By arranging the second parts 22 extending in the second direction b which connect the first part 21 extending in the first direction a, the second connecting wires 2 connecting the light-emitting driving units 121 and the light-emitting units 111 are in a longitudinal and transverse arrangement with the first connecting wires 1 and may be wound to the edge of the light-transmitting area 100 to achieve the object of increasing the number of drivable pixels in the light-transmitting area 100.

In the embodiments of the present disclosure, optionally, as shown in FIG. 2, edges of opposite sides of the light-transmitting area 100 are respectively provided with second connecting wires 2 for connecting part of the light-emitting units 111 and part of the light-emitting driving units 121. Specifically, the first parts 21 of the multiple second connecting wires 2 are arranged in parallel at the edges of the opposite sides of the light-transmitting area 100.

In the embodiments of the present disclosure, as shown in FIG. 2, optionally, part of the multiple light-emitting units 111 close to the light-emitting driving units 121 are connected to the light-emitting driving units 121 through the first connecting wires 1, and part of the multiple light-emitting units 111 remote from the light-emitting driving units 121 are connected to the light-emitting driving units 121 through the second connecting wires 2.

Specifically, among the multiple light-emitting units 111, a preset number of columns, of the light-emitting units 111, near the second light-transmitting area 120 and arranged in the second direction b are correspondingly connected to a preset number of columns, of the light-emitting driving units 121, near the first light-transmitting area 110 and arranged in the second direction b.

The specific value of the preset number may be determined according to the space area range in the first light-transmitting area 110 and the second light-transmitting area 120 and the requirement on arrangement density of the driving pixels in the light-transmitting area 100.

Optionally, as shown in FIG. 2, in the embodiments of the present disclosure, the light-emitting units 111 located in a same column are correspondingly connected to the light-emitting driving units 121 located in a same column, respectively.

Specifically, the light-emitting units 111 in a same column and arranged in the second direction b are correspondingly connected to the light-emitting driving units 121 in a same column and arranged in the second direction b, respectively.

By adopting this connection mode, the arrangement of the multiple first connecting wires 1 and the multiple second connecting wires 2 connected between the light-emitting units 111 and the light-emitting driving units 121 can be more regular.

Optionally, as shown in FIG. 2, among N columns of light-emitting driving units 121 and N columns of light-emitting units 111 connected by the first connecting wires 1, the first column of the light-emitting driving units 121 close to the light-emitting units 111 (i.e., the light-emitting driving units 121 closest to the light-emitting units 111), and the $N^{th}$ column of the light-emitting units 111 farthest away from the light-emitting driving units 121, are correspondingly connected; the second column of the light-emitting driving units 121 adjacent to the first column of the light-emitting driving units 121, and the $(N-1)^{th}$ column of the light-emitting units 111 adjacent to the $N^{th}$ column of the light-emitting units 111, are connected in one-to-one correspondence; and by analogy, N columns of the light-emitting driving units 121 and N columns of the light-emitting units 111 are correspondingly connected through the first connecting wires 1.

Among the $(N+1)^{th}$ to $M^{th}$ columns of the light-emitting driving units 121 and the $(N+1)^{th}$ to $M^{th}$ columns of the light-emitting units 111 connected by the second connecting wires 2, the $(N+1)^{th}$ column of the light-emitting units 111 closest to the light-emitting driving units 121 and the $(N+1)^{th}$ column of the light-emitting driving units 121 closest to the light-emitting units 111 are correspondingly connected; the $(N+2)^{th}$ column of the light-emitting units 111 adjacent to the $(N+1)^{th}$ column of the light-emitting units 111, and the $(N+2)^{th}$ column of the light-emitting driving units 121 adjacent to the $(N+1)^{th}$ column of the light-emitting driving units 121, are correspondingly connected; and by analogy, the $(N+1)^{th}$ to the $M^{th}$ light-emitting driving units 121 and the $(N+1)^{th}$ to the $M^{th}$ columns of the light-emitting units 111 can be correspondingly connected through the second connecting wires 2. N and M are positive integers, and M is larger than N.

Optionally, in the embodiments of the present disclosure, as shown in FIG. 2, adjacent columns of light-emitting units 111 are arranged in a staggered manner in the first light-transmitting area 110.

In the second light-transmitting area 120, the multiple pixel units 122 and the multiple light-emitting driving units 121 are sequentially arranged, and the covered area forms the second light-transmitting area 120. The multiple pixel units 122 are distributed at intervals among the multiple light-emitting driving units 121. Optionally, pixel units 122 are arranged between light-emitting driving units 121 that are spaced apart by two columns; and in columns where the pixel units 122 are arranged, the pixel units 122 are spaced apart from the light-emitting driving units 121. Optionally, in two adjacent columns of the pixel units 122, the pixel units 122 are arranged in the staggered manner.

For the display panel according to the embodiments of the present disclosure, combined with the FIGS. 1 and 2, in a case that it is installed in a display apparatus, the first light-transmitting area 110 corresponds to a camera area, and only the light-emitting units 111 of pixel units are arranged in the first light-transmitting area 110; the second light-transmitting area 120 is connected to the first light-transmitting area 110, optionally, the second light-transmitting area 120 may be an area arranged around the first light-transmitting area 110, and pixel units 122 and the light-emitting driving units 121 are arranged in the second light-transmitting area 120, where the light-emitting driving units 121 are formed as dummy pixels, and part of the light-emitting driving units 121 are connected to the light-emitting units 111 of the first light-transmitting area 110 in one-to-one correspondence, for driving the connected light-emitting units 111 to emit light.

In the embodiments of the present disclosure, the light-emitting unit 111 includes a light-emitting layer and an electrode plate located on a side of the light-emitting layer, and the light-emitting driving unit 121 includes a driving electrode. Each of the first connecting wire and the second connecting wire is connected with the electrode plate and the driving electrode via through holes; or, the second connecting wire is connected with the electrode plate and the driving electrode via through holes, the electrode plate of the light-emitting unit 111 extends to be connected with the driving electrode, and the electrode plate is also used as the first connecting wire.

Optionally, the electrode plate of the light-emitting unit 111 is an anode; and the driving electrode of the light-emitting driving unit 121 is a source/drain electrode.

In an embodiment, each of the first connecting wire 1 and the second connecting wire 2 is made of a transparent ITO material.

Figure 3:
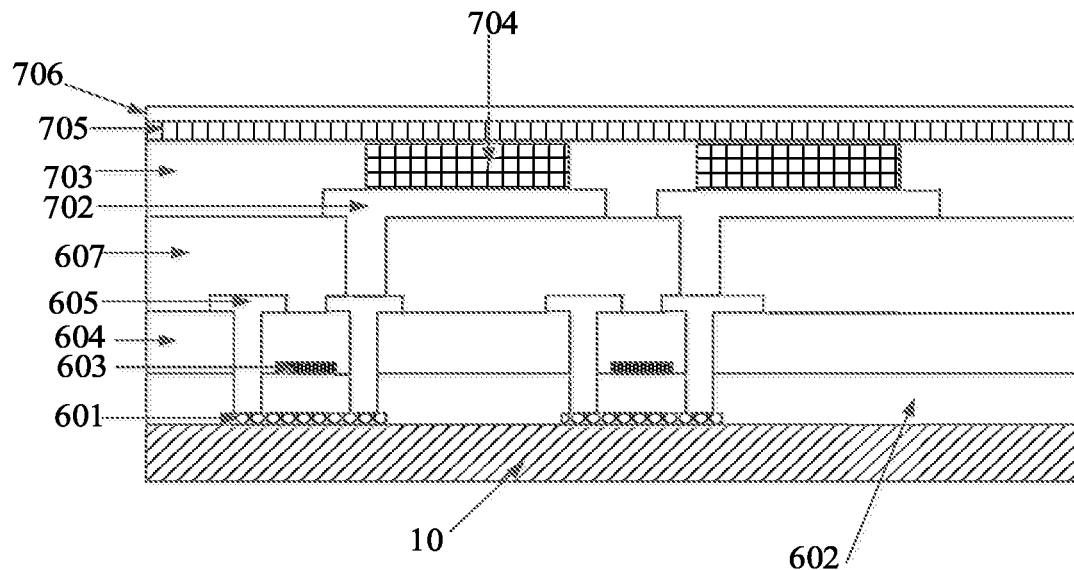
FIG. 3 is a schematic sectional view of pixel units in FIG. 2.

FIG. 3 is a schematic sectional view of the pixel units in FIG. 2, that is, a schematic sectional view of the pixel units 122.

Optionally, a case where the display panel is a top emission type of OLED display panel is taken as an example. As shown in FIG. 3, the pixel unit 122 of the display panel includes a substrate 10, and a driving unit and a light-emitting unit that are arranged on the substrate 10. The driving unit includes an active layer 601, a gate insulating layer 602, a gate electrode 603, an interlayer insulating layer 604 and a source/drain layer 605 that are sequentially formed on the substrate 10. The light-emitting unit include a first electrode 702, a light-emitting layer 704 arranged on a side of the first electrode 702 remote from the substrate 10, and a second electrode 705 arranged on a side of the light-emitting layer 704 remote from the substrate 10. Optionally, a spacer layer 706 is arranged on the second electrode 705. A pixel defining layer 703 is arranged on the first electrode 702, and the light-emitting layer 704 is arranged in the pixel defining layer 703. Optionally, the spacer layer 706 includes two opposite inorganic layers and an organic layer between the two inorganic layers.

The first electrode 702 is connected with the source/drain layer 605 via a through hole of a planarization layer 607, and the light-emitting unit may be driven to emit light through the driving unit.

In the embodiments of the present disclosure, optionally, the first electrode 702 is an anode and the second electrode 705 is a cathode. The light-emitting layer 704 includes a hole injection layer, a hole transport layer, a light-emitting layer, an electron transport layer, and an electron injection layer, which are arranged successively.

Optionally, the substrate 10 may be a transparent layer including multiple organic and inorganic layers that are spaced apart.

It will be understood that, a barrier layer, a buffer layer or the like may be arranged between the substrate 10 and the active layer 601, which will not be described further herein.

It should be noted that the specific structure of the pixel unit 122 arranged in the light-transmitting area 100 is the same as that of the pixel unit arranged in the display area 3 of the display panel, and the specific structure of the pixel unit 122 is not limited to only the structure according to the above embodiments, which will not be further illustrated herein.

Figure 4:
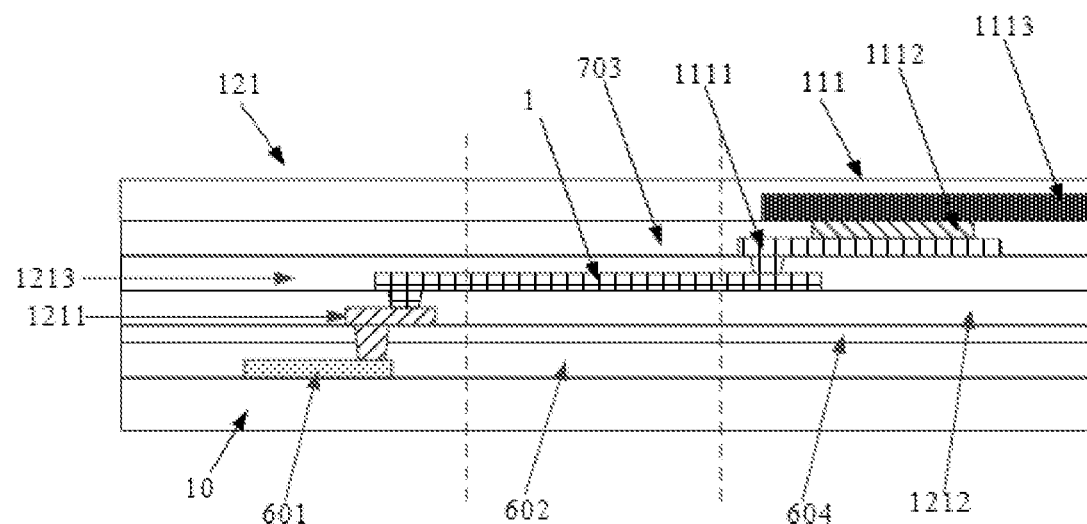
FIG. 4 is a first schematic sectional view of a light-emitting driving unit, a first connecting wire and a light-emitting unit in a light-transmitting area in FIG. 2.

FIG. 4 is a schematic sectional view of the light-emitting driving unit 121, the first connecting wire 1 and the light-emitting unit 111 in the light-transmitting area 100 in FIG. 2.

Referring to FIG. 4, the light-emitting driving unit 121, the first connecting wire 1, and the light-emitting unit 111 are arranged on the substrate 10.

The light-emitting driving unit 121 includes an active layer 601, a gate insulating layer 602, an interlayer insulating layer 604 and a driving electrode 1211 which are arranged on a substrate 10, and the driving electrode 1211 is connected with the active layer 601 via a through hole penetrating through the interlayer insulating layer 604 and the gate insulating layer 602. Specifically, combined with FIG. 3, the active layer 601 of the light-emitting driving unit 121 is on a same layer as the active layer 601 of the pixel unit 122 in the display area, and they may be manufactured by using a same patterning process; the gate insulating layer 602 of the light-emitting driving unit 121 is on a same layer as the gate insulating layer 602 of the pixel unit 122 and they may be manufactured by using a same patterning process; and the interlayer insulating layer 604 of the light-emitting driving unit 121 is on a same layer as the interlayer insulating layer 604 of the pixel unit 122 and they may be manufactured by using a same patterning process.

Optionally, a first planarization layer 1212 is arranged on the interlayer insulating layer 604, where the first connecting wires 1 are arranged on the first planarization layer 1212 and extend toward the light-emitting units 111; and a second planarization layer 1213 is arranged on the first planarization layer 1212.

The light-emitting unit 111 includes an anode 1111, a pixel defining layer 703, a light-emitting layer 1112 and a cathode 1113 that are arranged on the second planarization layer 1213 successively. The anode 1111 is connected with the first connecting wire 1 via a through hole penetrating through the second planarization layer 1213.

It should be noted that the number of planarization layer 607 of the pixel unit 122 may be two, where the two planarization layers 607 are respectively located at same layers as the first planarization layer 1212 and the second planarization layer 1213 of the light-transmitting area 100, and the two planarization layers 607 are manufactured by using patterning processes same as the first planarization layer 1212 and the second planarization layer 1213 respectively; and the pixel defining layer 703 in the light-transmitting area 100 and the pixel defining layer 703 of the pixel unit 122 are on a same layer and are manufactured by using a same patterning process.

With the structure according to the embodiments described above, a voltage signal is inputted to the driving electrode 1211 of the light-emitting driving unit 121, and the voltage signal may be transmitted to the anode 1111 of the light-emitting unit 111 by using the first connecting wire 1, for driving the anode 1111 so as to emit light for image display.

It should be noted that, referring to FIG. 4 in combination with FIG. 2, optionally, the structure with which the second connecting wire 2 connects the light-emitting driving unit 121 and the light-emitting unit 111 may be the same as that of the first connecting wire 1, i.e., the first connecting wire 1 in FIG. 4 may be the second connecting wire 2, except that the second connecting wire 2 is wound around the edge of the light-transmitting area 100, and the second connecting wire 2 is connected to the light-emitting driving unit 121 and the light-emitting unit 111, which will not be further described herein.

In the embodiments, optionally, each of the first connecting wire 1 and the second connecting wire 2 may be made of a transparent ITO material.

Figure 5:
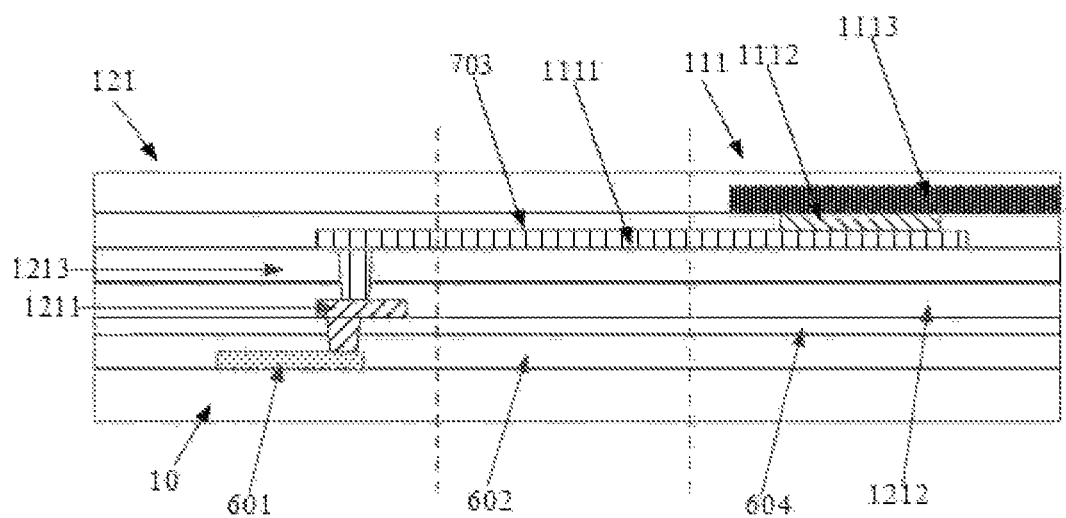
FIG. 5 is a second schematic sectional view of a light-emitting driving unit, a first connecting wire and a light-emitting unit in a light-transmitting area in FIG. 2.

In another embodiment of the present disclosure, as shown in FIG. 5, the light-emitting driving unit 121 include an active layer 601, a gate insulating layer 602, an interlayer insulating layer 604, and a driving electrode 1211 which are arranged on the substrate 10, where the driving electrode 1211 is connected to the active layer 601 via a through hole penetrating the interlayer insulating layer 604 and the gate insulating layer 602; and the first planarization layer 1212 and the second planarization layer 1213 are sequentially arranged on the interlayer insulating layer 604, and the anode 1111 of the light-emitting unit 111 is arranged on the second planarization layer 1213, extends to the light-emitting driving unit 121, and is connected with the driving electrode 1211 via a through hole penetrating through the first planarization layer 1212 and the second planarization layer 1213.

With the structure according to the embodiments, in the light-transmitting area 100, the anode of the light-emitting unit 111 of the first light-transmitting area 110 may be also used as the first connecting wire 1, extends to the second light-transmitting area 120 and connected to the driving electrode 1211 of the light-emitting driving unit 121. There is no need to separately arranging connecting wires, hence, as compared with the implementations of the first connecting wire in the above embodiments, the effect of increasing the number of controllable pixel structures can be achieved.

Since the anode of the light-emitting unit 111 is generally a light-tight structure, in the embodiments of the present disclosure, optionally, part of the first connecting wires 1 may be made of transparent ITO material and part of the first connecting wires 1 may adopting the means of reusing the anodes of the light-emitting units 111.

It should be noted that the structures of the light-emitting unit and the light-emitting driving unit in the light-transmitting area according to the above-described embodiments, and the arrangement of the first connecting wires and the second connecting wires in the light-transmitting area, are merely examples and the present disclosure is not limited thereto. For example, the first connecting wire and/or the second connecting wire may be provided as a multi-layer structure, which will not be further illustrated in detail herein.

According to the display panel disclosed by the embodiments of the present disclosure, the control number of the light-emitting devices in the light-transmitting display area of the camera can be increased, and the size of the light-transmitting display area can be increased; and for a product provided with a front camera having a small size, the pixel density of the light-transmitting display area can be improved, and the display quality can be improved.

The embodiments of the present disclosure also provide a display apparatus, where the display apparatus includes the display panel described in any of the embodiments above.

Optionally, the display apparatus further includes a camera module, and an orthographic projection of the camera module onto a plane where the display panel is located is in the first light-transmitting area.

Specifically, the camera module is formed as a front camera of the display apparatus and forms an off-screen camera structure.

According to the above detailed descriptions of the display panel, those skilled in the art will appreciate the specific structure of the display apparatus adopting the display panel according to the embodiments of the present disclosure, which will not be further described in detail herein.

Another embodiment of the present disclosure also provides a manufacturing method of the display panel, where the method includes:

providing a transparent base substrate;
manufacturing the multiple light-emitting units on a partial area of a first area of the base substrate to form the first light-transmitting area; manufacturing the multiple light-emitting driving units on a partial area of the first area to form the second light-transmitting area; manufacturing the first connecting wires in the first area, where each of some of the plurality of light-emitting units is correspondingly connected with one light-emitting driving unit through the first connecting wire; and manufacturing the second connecting wires at an outer edge of the first area, where each of some of the light-emitting units is correspondingly connected with one light-emitting driving unit through the second connecting wire.

Optionally, in the manufacturing method, the light-emitting unit include a light-emitting layer and an electrode plate on a side of the light-emitting layer, and the light-emitting driving unit includes a driving electrode. Each of the first connecting wire and the second connecting wire is manufactured between the electrode plate and the driving electrode and is connected with the electrode plate and the driving electrode via through holes; or, the second connecting wire is manufactured between the electrode plate and the driving electrode and is connected with the electrode plate and the driving electrode via through holes; and the first connecting wire and the electrode plate are manufactured by a same patterning process, and the electrode plate is also used as the first connecting wire.

With reference to FIGS. 4 and 5, and in light of the above detailed descriptions, those skilled in the art will appreciate the specific manufacturing process of the display panel according to the embodiments of the present disclosure, which will not be further described in detail herein.

Unless otherwise defined, technical terms or scientific terms used in the present disclosure shall have common meanings understood by those ordinary skilled in the art. Terms such as "first" and "second" in the present disclosure do not indicate any order, quantity or importance, and they are merely used to distinguish different components. Terms such as "include" or "have" indicate that an element or object before such terms covers an element, an object or the equivalent enumerated after such terms, and do not exclude other elements and objects. Terms such as "coupled" and "connected" are not limited to physical or mechanical connection, they may include direct or indirect electrical connection. Terms such as "above", "below", "left" and "right" are merely to describe relative position relationships, and if an absolute position of a described object changes, relative positions with respect to the described object may change correspondingly.

It can be understood that, if a layer, a film, an area or an element such as a substrate is described to be on or below another element, the element may be directly on or below the another element, or there may be an intermediate element between the element and the another element.

In the descriptions of the above embodiments, specific features, structures, materials, or characteristics may be combined in any one or more embodiments or examples in a suitable manner.

The above descriptions are merely some implementations of the present disclosure, and the protection scope of the present disclosure is not limited thereto. For those of ordinary skill in the art, within the technical scope disclosed in the present disclosure, changes or substitutions can be made. These changes or substitutions shall fall with the protection scope of the present disclosure. Therefore, the protection scope of the present disclosure is determined by the claims.

What is claimed is:

1. A display panel, comprising a light-transmitting area, wherein the light-transmitting area comprises:

a first light-transmitting area, which is provided with a plurality of light-emitting units distributed at intervals; and a second light-transmitting area, which is provided with a plurality of light-emitting driving units capable of transmitting light, wherein the first light-transmitting area is connected with the second light-transmitting area;

wherein each light-emitting unit of the plurality of light-emitting units is connected with a light-emitting driving unit of the plurality of light-emitting driving units, and the light-emitting driving units each are configured to drive the connected light-emitting unit to emit light; part of the plurality of light-emitting units are connected with the light-emitting driving units through first connecting wires in the light-transmitting area, and part of the plurality of light-emitting units are connected with the light-emitting driving units through second connecting wires outside the light-transmitting area; and the second connecting wires are arranged along an edge of the light-transmitting area;

wherein the light-emitting unit comprises a light-emitting layer and an electrode plate on a side of the light-emitting layer, and the light-emitting driving unit comprises a driving electrode; and wherein:

each of the first connecting wires and the second connecting wires is connected to the electrode plate and the driving electrode via through holes; or, the second connecting wire is connected with the electrode plate and the driving electrode via through holes, the electrode plate of the light-emitting unit extends to be connected with the driving electrode, and the electrode plate is also used as the first connecting wire.

2. The display panel according to claim 1, wherein the first connecting wires extend in a first direction, and two ends of each of the first connecting wires are respectively connected with one light-emitting driving unit and one light-emitting unit;

wherein each of the plurality of second connecting wire comprises a first part extending in the first direction and arranged along the edge of the light-transmitting area and two second parts extending in a second direction; and the second direction is perpendicular to the first direction, two ends of one of the two second parts are respectively connected with a first end of the first part and one light-emitting driving unit, and two ends of the other of the two second parts are respectively connected with a second end of the first part and one light-emitting unit.

3. The display panel according to claim 1, wherein the second light-transmitting area further comprises a plurality of pixel units, and the plurality of pixel units is arranged at intervals among the plurality of light-emitting driving units.

4. The display panel according to claim 3, wherein the plurality of pixel units and the plurality of light-emitting driving units are sequentially arranged in rows and columns in the second light-transmitting area.

5. The display panel according to claim 1, wherein part of the plurality of light-emitting units close to the light-emitting driving units are connected to the light-emitting driving units through the first connecting wires, and part of the plurality of light-emitting units remote from the light-emitting driving units are connected to the light-emitting driving units through the second connecting wires.

6. The display panel according to claim 1, wherein edges of opposite sides of the light-transmitting area are respectively provided with the second connecting wires used for connecting part of the light-emitting units and the light-emitting driving units.

7. The display panel according to claim 1, wherein the light-emitting units in a same column are respectively connected to the light-emitting driving units in a same column correspondingly.

8. The display panel according to claim 1, wherein the second light-transmitting area is around the first light-transmitting area.

9. The display panel according to claim 1, further comprising a display area in which a plurality of pixel units in an array are arranged;
wherein the display area is around the light-transmitting area, or the light-transmitting area is arranged at an edge of the display area.

10. A display apparatus, comprising a display panel, wherein the display panel comprises a light-transmitting area, and the light-transmitting area comprises:
a first light-transmitting area, which is provided with a plurality of light-emitting units distributed at intervals; and
a second light-transmitting area, which is provided with a plurality of light-emitting driving units capable of transmitting light, wherein the first light-transmitting area is connected with the second light-transmitting area;
wherein each light-emitting unit of the plurality of light-emitting units is connected with a light-emitting driving unit of the plurality of light-emitting driving units, and the light-emitting driving units each are configured to drive the connected light-emitting unit to emit light; part of the plurality of light-emitting units are connected with the light-emitting driving units through first connecting wires in the light-transmitting area, and part of the plurality of light-emitting units are connected with the light-emitting driving units through second connecting wires outside the light-transmitting area; and the second connecting wires are arranged along an edge of the light-transmitting area;
wherein the light-emitting unit comprises a light-emitting layer and an electrode plate on a side of the light-emitting layer, and the light-emitting driving unit comprises a driving electrode; and wherein:
each of the first connecting wires and the second connecting wires is connected to the electrode plate and the driving electrode via through holes; or,
the second connecting wire is connected with the electrode plate and the driving electrode via through holes, the electrode plate of the light-emitting unit extends to be connected with the driving electrode, and the electrode plate is also used as the first connecting wire.

11. The display apparatus according to claim 10, further comprising a camera module, wherein an orthographic projection of the camera module onto a plane where the display panel is located is in the first light-transmitting area.

12. The display apparatus according to claim 10, wherein the first connecting wires extend in a first direction, and two ends of each of the first connecting wires are respectively connected with one light-emitting driving unit and one light-emitting unit;
wherein each of the plurality of second connecting wire comprises a first part extending in the first direction and arranged along the edge of the light-transmitting area and two second parts extending in a second direction; and the second direction is perpendicular to the first direction, two ends of one of the two second parts are respectively connected with a first end of the first part and one light-emitting driving unit, and two ends of the other of the two second parts are respectively connected with a second end of the first part and one light-emitting unit.

13. The display apparatus according to claim 10, wherein the second light-transmitting area further comprises a plurality of pixel units, and the plurality of pixel units is arranged at intervals among the plurality of light-emitting driving units.

14. The display apparatus according to claim 13, wherein the plurality of pixel units and the plurality of light-emitting driving units are sequentially arranged in rows and columns in the second light-transmitting area.

15. The display apparatus according to claim 10, wherein part of the plurality of light-emitting units close to the light-emitting driving units are connected to the light-emitting driving units through the first connecting wires, and part of the plurality of light-emitting units remote from the light-emitting driving units are connected to the light-emitting driving units through the second connecting wires.

16. A manufacturing method of the display panel according to claim 1, comprising:
providing a transparent base substrate;
manufacturing the plurality of light-emitting units on a partial area of a first area of the base substrate to form the first light-transmitting area;
manufacturing the plurality of light-emitting driving units on a partial area of the first area to form the second light-transmitting area;
manufacturing the first connecting wires in the first area, wherein each of some of the plurality of light-emitting units is correspondingly connected with one light-emitting driving unit through the first connecting wire; and
manufacturing the second connecting wires at an outer edge of the first area, wherein each of some of the light-emitting units is correspondingly connected with one light-emitting driving unit through the second connecting wire;
wherein the light-emitting unit comprises an anode, and the light-emitting driving unit comprises a source/drain layer; and wherein:
each of the first connecting wire and the second connecting wire is manufactured between the anode and the source/drain layer and is connected to the anode and the source/drain layer via through holes; or,
the second connecting wire is manufactured between the anode and the source/drain layer and is connected with the anode and the source/drain layer via through holes, the first connecting wire and the anode are manufactured by a same patterning process, and the anode is also used as the first connecting wire.

* * * * *